United States Patent
Potluri

(10) Patent No.: US 9,525,421 B2
(45) Date of Patent: Dec. 20, 2016

(54) HIGH SPEED LOW VOLTAGE HYBRID OUTPUT DRIVER FOR FPGA I/O CIRCUITS

(71) Applicant: Microsemi SoC Corporation, San Jose, CA (US)

(72) Inventor: Krishna Chaitanya Potluri, Hyderabad (IN)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 15/043,663

(22) Filed: Feb. 15, 2016

(65) Prior Publication Data

US 2016/0241246 A1 Aug. 18, 2016

(30) Foreign Application Priority Data

Feb. 18, 2015 (IN) .......................... 514/MUM/2015

(51) Int. Cl.
*H03K 19/177* (2006.01)
*H03K 19/173* (2006.01)
*H03K 19/0185* (2006.01)

(52) U.S. Cl.
CPC ...... *H03K 19/17744* (2013.01); *H03K 19/018521* (2013.01); *H03K 19/1733* (2013.01)

(58) Field of Classification Search
CPC .................. H03K 19/0826; H03K 19/09429; H03K 19/017509; H03K 19/018507; H03K 19/018521; H03K 19/018571; H03K 19/017518; H03K 19/017554; H03K 19/01806; H03K 19/09418; H03K 19/09448; H03K 19/212; H03K 17/164; H03K 19/0016; H03K 19/00323; H03K 19/00361; H03K 2217/0081; H03K 2217/94094; H03K 19/00315; H03K 19/018585; H03K 17/167; H03K 19/0948; H03K 19/0027; H03K 19/00384; H03K 19/01721; H03K 19/018592; H03K 19/215; G06F 13/4086; G06F 13/4234; H04L 25/0272; H04L 25/0278; H04L 25/028; H04L 25/0286; H04L 25/0292

See application file for complete search history.

(56) References Cited

U.S. PATENT DOCUMENTS 6,043,680 A * 3/2000 Dasgupta ......... H03K 19/00315
326/57
6,174,730 B1 * 1/2001 Kohno ............... A61K 51/0402
128/898

(Continued)

*Primary Examiner* — Vibol Tan
(74) *Attorney, Agent, or Firm* — Leech Tishman Fuscaldo Lampl; Kenneth D'Alessandro, Esq.

(57) ABSTRACT

A hybrid input/output pad driver includes an input node in a first voltage supply domain coupled to a p-device driver in the second voltage supply domain and an n-device driver in the second voltage domain. A p-channel pullup transistor is coupled between a voltage potential in a third voltage domain and an input/output pad. Its gate is coupled to the output of the p-device driver. An n-channel pulldown transistor is coupled between ground and the input/output pad. Its gate is coupled to the output of the n-device driver. An n-channel pullup transistor has a source coupled to the input/output pad, a drain coupled to the voltage potential in the third voltage supply domain. An inverter in the second voltage supply domain is programmably connectable between the output of the p-driver circuit and the gate of the n-channel pullup transistor.

9 Claims, 4 Drawing Sheets

(56) References Cited

U.S. PATENT DOCUMENTS

| | | | |
|---|---|---|---|
| 6,809,546 B2* | 10/2004 | Song | H04L 25/0278 326/30 |
| 8,410,772 B1* | 4/2013 | Potluri | H03F 1/301 323/313 |
| 8,829,983 B1* | 9/2014 | Potluri | G05F 1/468 327/112 |
| 9,129,694 B2* | 9/2015 | Song | H03K 19/0027 |
| 9,306,572 B2* | 4/2016 | Qi | H03K 19/0948 |
| 2003/0071662 A1* | 4/2003 | Kwong | H01L 27/0285 327/112 |
| 2003/0090293 A1* | 5/2003 | Yen | H03K 17/164 326/86 |
| 2016/0241246 A1* | 8/2016 | Potluri | H03K 19/17744 |

* cited by examiner

HIGH SPEED LOW VOLTAGE HYBRID OUTPUT DRIVER FOR FPGA I/O CIRCUITS

CROSS-REFERENCE TO RELATED APPLICATIONS

This application claims the priority from Indian Patent Application No. 514/MUM/2015, filed Feb. 18, 2015, the contents of which are incorporated in this disclosure by reference in their entirety.

BACKGROUND

The feature sizes of transistors in CMOS technology continue to shrink as technology advances. As a result, the core supply voltage of integrated circuits also drops. For example, when feature sizes shrink from 0.15 nm technology to 90 nm technology, the core supply voltage drops to 0.9V from 1.5V. However, when interfacing the integrated circuit with external components, in many cases the integrated circuit needs to be compatible with older technologies having a 3.3V supply.

Generally a field programmable gate array (FPGA) operates using different voltages for the logic inside the chip. For example, core logic can be operated at a voltage of 1V while the pre-driver circuits for the input/output (I/O) circuits can be operated at a voltage of 1.8 v. The only restriction is typically that the output voltage that the FPGA sends to off-chip devices to which it is coupled should be as per a standard for those external devices.

$V_{CCO}$ is a general term used for output stage power supply voltage. There is no fixed level for the $V_{CCO}$ supply for an FPGA, but the range is typically from 1.2V to 3.6V. This voltage value is determined by interface specifications for the protocol between the FPGA and the other integrated circuit (IC) devices communicating with the FPGA. If the FPGA is programmed to the LVCMOS25 standard, it is expected that the FPGA and the ICs communicating with the FPGA operate using an output stage voltage ($V_{CCO}$) of 2.5V. If the FPGA is programmed to the DDR3 standard, it is expected that the FPGA and the DDR3 IC communicating with the FPGA operate using an output stage voltage ($V_{CCO}$) of 1.5V. If the FPGA is programmed to the DDR4 standard, it is expected that the FPGA and the DDR4 communicating with the FPGA operate using an output stage voltage ($V_{CCO}$) of 1.2V. Ideally, an FPGA should be able to interface with other ICs at any voltage within this range.

Generally the power supply voltage for the internal logic in an FPGA is 1V to operate the transistors at their maximum speed. When this internal voltage is driving the final stage (driver), the driver transistor will see the internal voltage on its gate, but will see the external voltage $V_{CCO}$ across its source/drain terminals (e.g., 1.5V).

Some integrated circuit manufacturing processes that are used to fabricate FPGA ICs support oxide thicknesses that allow operating voltages of 2.5V for CMOS I/O transistors and 1V for CMOS core transistors. As briefly noted above, the manufactured FPGA has to support various standards with variety of voltages, ranging from 1.2V to 3.3V. However, when used to implement DDR3 and DDR4 interfaces, a 2.5V I/O transistor operating at voltages of 1.5V and 1.2V cannot perform at the targeted DDR3 and DDR4 speeds.

There are several reasons for this deficiency. Due to its thick oxide, the 2.5V I/O transistor is slow and exhibits a threshold voltage, commonly expressed as $V_{th}$, of 800 mv. With a $V_{th}$ of 800 mV and lower output voltages (1.5V and 1.2V) of the respective DDR3 and DDR4 interfaces, the gate-source overdrive voltage (head room) is so low that the transistors cannot switch at higher speeds. If output transistors are sized larger to achieve the higher switching speeds, their self-capacitance dominates and contributes to limiting the switching speeds.

By optimizing size and speed, a 2.5V I/O transistor can switch at maximum speed of 333 MHz with output voltages compatible with DDR3 and DDR4, however minimum speeds for DDR3 and DDR4 are respectively 400 MHz and 800 MHz. Using 1.8V I/O transistors at the output stage to resolve this conflict involves major process changes and multiple oxide implants. This will increase the manufacturing costs, and may not even be possible to do because of the required process modifications.

Previous generations of general-purpose input/output (GPIO) circuits do not have DDR3 capability. A current challenge in GPIO circuits is the need for an internal block design (level shifter/pre-driver) to be able to use 2.5V thick oxide transistors for reliability and yet be capable of DDR3 and DDR4 speeds.

If an FPGA device has to accommodate DDR3 and DDR4 speeds using standard design architectures, it will have to compromise on device reliability and contend with significant process cost increases. If the 1V core transistors are used to implement DDR3 and DDR4 interfaces, requiring operating voltages of 1.5V and 1.2V, these transistors cannot sustain the excess stress and moreover they will prevent the FPGA from interfacing with DDR devices. This will defeat the purpose of using an FPGA in a variety of electronic applications.

The present invention addresses the specific problem of using the FPGA I/O buffers to operate at low operational voltages and high speeds that are necessary to operate DDR3/4 devices. The FPGA I/O buffers preferably do not have problems operating at the lower speeds encountered with interfaces like LVCMOS15/12.

A level shifter circuit is required to convert the signals from the core supply level to the I/O supply level in order to communicate with outside components. The conventional level shifter circuits in the GPIO circuits are targeted for high voltage standards like LVCMOS33/25 PCI. The maximum voltage is 3.6V. The 2.5V device can withstand 3.6V by increasing its length proportionately. A conventional level shifter circuit can fulfill the task of converting a 1.5V signal to a 3.3V signal. However, in 90 nm technology or other technologies that provide a very low core supply voltage, present level shifter circuits can only handle relatively low speed signals. Current GPIO circuits are speed restricted due to use of the extra-long thick oxide devices needed to tolerate up to 3.6V at the output. Advanced techniques are needed to improve the speed and performance at DDR3, DDR4 speeds.

SUMMARY

By virtue of the fact that DDR data or clock signals are not full rail-to-rail signals, the present invention employs n-channel devices for a major part of the pullup function and also uses a regular p-channel pullup device to pull the voltage up to the rail if required. The solution provided by the present invention is completely programmable and presents very low risk. Since the pullup function of the I/O buffer uses both p-channel and n-channel transistors, it is referred to as a hybrid driver.

According to one embodiment of the present invention, a hybrid input/output pad driver includes an input node in a first voltage supply domain. A p-channel device driver in the second voltage supply domain has an input coupled to the input node and an output. An n-channel device driver in the second voltage domain has an input coupled to the input node and an output. A p-channel pullup transistor has a source coupled to a voltage potential in a third voltage domain, a drain coupled to an input/output pad, and a gate coupled to the output of the p-channel device driver. An n-channel pulldown transistor has a source coupled to ground, a drain coupled to the input/output pad, and a gate coupled to the output of the n-channel device driver. An n-channel pullup transistor has a source coupled to the input/output pad, a drain coupled to the voltage potential in a third voltage supply domain, and a gate. A connection between the gate of the n-channel pullup transistor and the p-channel device driver is programmable. In one embodiment, a logic gate in the second voltage supply domain has a signal input an enable input and an output. The signal input of the logic gate has a connection to the output of the p-channel driver circuit. The output of the logic gate has a connection to the gate of the n-channel pullup transistor. The enable input allows the connection to be programmable.

According to another aspect of the present invention, the input node of the hybrid input/output pad driver is coupled to the inputs of the p-channel device driver and the n-channel device driver through a level shifter having an input coupled to the input node and an output coupled to the inputs of the p-channel device driver and the n-channel device driver, and has an input in the first voltage supply domain and an output in a second voltage supply domain.

DRAWINGS

These and other features, aspects and advantages of the present invention will become better understood with regard to the following description, appended claims, and accompanying drawings where:

DESCRIPTION

Persons of ordinary skill in the art will realize that the following description of the present invention is illustrative only and not in any way limiting. Other embodiments of the invention will readily suggest themselves to such skilled persons.

Figure 1:
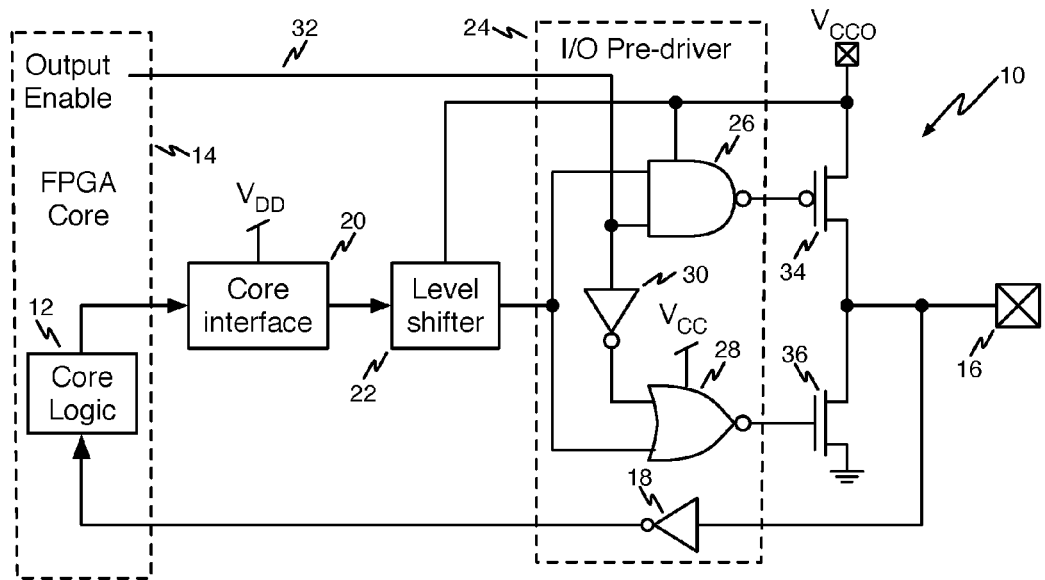
FIG. 1 is a schematic diagram showing a representative prior-art GPIO circuit.

Referring first to FIG. 1, a schematic diagram shows a representative prior-art GPIO circuit 10 used to convert signals from core logic 12 in an FPGA core 14 to signals on I/O pad 16 when it is used as an output from the FPGA. GPIO circuit 10 also includes buffer 18 to buffer external signals presented on I/O pad 16 for presentation to the FPGA core logic 12 when I/O pad 16 is used as an input to the FPGA.

When I/O pad 16 is used as an output from the FPGA, signals from core logic 12 are presented to core interface 20, which is a conventional interface circuit. Core interface 20 is powered from the $V_{DD}$ supply used to power the FPGA core 14, and its output signals are thus at the voltage levels of core logic 12.

The signals from core interface 20 are presented to level shifter 22. Level shifter 22 is powered from the $V_{CCO}$ supply used to power devices external to the FPGA and is arranged to shift the level of the signals from that used in core logic 12 to that used on I/O pad 16. The output of level shifter 22 is presented to I/O pre-driver circuit 24 that includes NAND gate 26, NOR gate 28, and inverter 30. NAND gate 26, NOR gate 28, and inverter 30 are all powered from the $V_{CCO}$ power supply at the voltage level necessary for driving the external devices to which the FPGA will be interfaced. The output of level shifter 22 drives one input of each of NAND gate 26 and NOR gate 28. The other input of NAND gate 26 is coupled to an output enable line 32 from FPGA core 14 and the other input of NOR gate 28 is coupled to the complement of the signal on output enable line 32, the complement generated through inverter 30.

The output of NAND gate 26 is coupled to the gate of p-channel pullup transistor 34. The output of NOR gate 28 is coupled to the gate of n-channel pulldown transistor 36. The source of p-channel pullup transistor 34 is coupled to an external $V_{CCO}$ power supply through a power supply terminal. The drains of the p-channel pullup transistor 34 and the n-channel pulldown transistor 36 are connected in common to the I/O pad 16 and the source of the n-channel pulldown transistor 36 is connected to ground, or a common potential.

When I/O pad 16 is used as an output from the FPGA, output enable line 32 is brought to a high logic level, thus enabling the signals from level shifter 22 to be passed through NAND gate 26 and NOR gate 28 to the gates of the p-channel pullup transistor 34 and the n-channel pulldown transistor 36. A logic one signal at the output of level shifter circuit 22 will present a logic zero signal at the output of NAND gate 26 and a logic zero signal at the output of NOR gate 28. The n-channel pulldown transistor 36 will thus be turned off and the p-channel pullup transistor 34 will thus be turned on, pulling the I/O pad up to a p-channel threshold below $V_{CCO}$. Conversely, a logic zero signal at the output of level shifter circuit 22 will present a logic one signal at the output of NAND gate 26 and a logic one signal at the output of NOR gate 28. The p-channel pullup transistor 34 will thus be turned off and the n-channel pulldown transistor 36 will thus be turned on, pulling the I/O pad down to an n-channel threshold above ground.

The prior-art GPIO circuit 10 is suitable for most applications, and the conventional level shifter circuit 22 can fulfill the task of converting a 1.5V signal to a 3.3V signal. However, in 90 nm technology or other technologies that provide a very low core supply voltage, level shifter circuit 22 can only handle relatively low speed signals. Current GPIO circuits are speed restricted due to usage of the extra-long thick oxide devices needed to tolerate up to 3.6V in the I/O channel, such as p-channel pullup transistor 34 and n-channel pulldown transistor 36.

Figure 2:
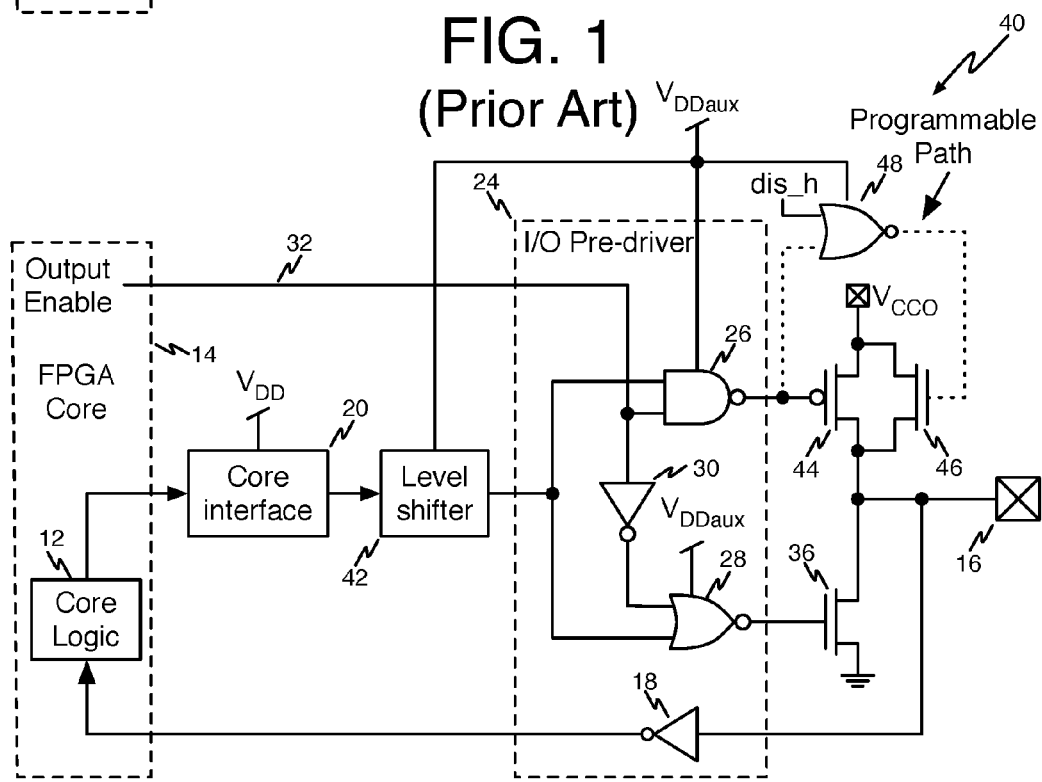
FIG. 2 is a schematic diagram showing a representative GPIO circuit including a hybrid input/output pad driver circuit in accordance with the present invention.

Referring now to FIG. 2, a schematic diagram shows a representative GPIO circuit 40 in accordance with the principles of the present invention. To the extent that circuit elements in the GPIO circuit 40 of FIG. 2 are the same as corresponding elements in the prior-art GPIO circuit 10 of FIG. 1, like reference numerals will be used to identify those circuit elements.

FPGA ICs have three power supplies used for data exchange. The following notation will be used herein. $V_{DD}$ (1V) for core circuits; $V_{DDaux}$ (1.8V) is an auxiliary power supply used for I/O logic (e.g., pre-drivers); and $V_{CCO}$ is the I/O power supply. The I/O pad driver is powered with $V_{CCO}$. The voltage value of $V_{CCO}$ depends on the industry standard for operation of the particular external circuits that are coupled to the FPGA, for example: DDR3=1.5V; DDR4=1.2V; LVCMOS33=3.3V; and LVCMOS25=2.5V.

GPIO circuit 40 is also used to convert signals from core logic 12 in an FPGA core 14 to signals on I/O pad 16 when it is used as an output from the FPGA. GPIO circuit 40 also includes buffer 18 to buffer external signals presented on I/O pad 16 for presentation to the FPGA core logic 12 when I/O pad 16 is used as an input to the FPGA.

When I/O pad 16 is used as an output from the FPGA, signals from core logic 12 are presented to core interface 20, which is a conventional interface circuit. Core interface 20 is powered from the $V_{DD}$ supply used to power the FPGA core 14.

The signals from core interface 20 are presented to level shifter 42. Level shifter 42 is configured as a high-speed level shifter circuit in accordance with one aspect of the present invention. An exemplary high-speed level shifter circuit will be disclosed herein with reference to FIG. 4A.

To establish a data transfer link with devices external to the FPGA at voltages defined by the chosen industrial standard, the final driver comprised of a p-channel pullup transistor 44, an n-channel pullup transistor 46 and an n-channel pulldown transistor 36 is powered with supply $V_{CCO}$ (which, as indicated above, varies as per the chosen standard e.g. 1.2V 1.5V 1.8V 2.5V 3.3V). I/O pre-driver 24 and level shifter 42 are powered from the $V_{DDaux}$ supply to maintain the logic circuit delays almost constant irrespective of the chosen standard. As a result, the outputs of level shifter 42 that drive the I/O pre-driver 24 and the outputs of the I/O pre-driver 24 that drive p-channel pullup transistor 44 and n-channel pulldown transistor 36 are in the range of 0V to $V_{DDaux}$. The output of level shifter 42 is presented to I/O pre-driver circuit 24 that includes NAND gate 26, NOR gate 28, and inverter 30. The output of level shifter 42 drives one input of each of NAND gate 26 and NOR gate 28. The other input of NAND gate 26 is coupled to an output enable line 32 from FPGA core 14 and the other input of NOR gate 28 is coupled to the complement of the signal on output enable line 32, the complement generated through inverter 30.

The output of NAND gate 26 is coupled to the gate of p-channel pullup transistor 44. The output of NOR gate 28 is coupled to the gate of n-channel pulldown transistor 36. The source of p-channel pullup transistor 44 is coupled to a power supply terminal on the integrated circuit that is connected to the $V_{CCO}$ power supply external to the integrated circuit during operation. The drains of the p-channel pullup transistor 44 and the n-channel pulldown transistor 36 are connected in common to the I/O pad 16 and the source of the n-channel pulldown transistor 36 is connected to ground, or other common potential.

In addition to p-channel pullup transistor 44 and the n-channel pulldown transistor 36, the GPIO circuit of FIG. 2 includes an n-channel transistor 46 connected in parallel with p-channel pullup transistor 44. The gate of n-channel transistor 46 is connected to the output of a NOR gate 48. A first input of NOR gate 48 is driven from the output of NAND gate 26 and a second input of NOR gate 46 is driven from an enable signal dish.

The conventional prior-art driver circuit 10, as described above in relation to FIG. 1, includes the p-channel transistor 34, analogous to p-channel transistor 44, as a pullup element and the n-channel transistor 36 as a pulldown element for I/O pad 16. The hybrid driver circuit of the present invention includes a combination of p-channel transistor 44 and n-channel transistor 46 as a pullup element and n-channel transistor as a pulldown element for I/O pad 16.

To turn on the hybrid driver circuit pullup element, both p-channel transistor 44 and n-channel transistor 46 need to be driven with complimentary inputs on their gates. NOR gate 48 in the programmable path (shown in dashed lines) provides the correct polarity signal to n-channel transistor 46 inside the hybrid driver circuit pull up element. NOR gate 48 further employs the control signal dis_h to enable/disable hybrid mode of operation of the driver as shown in FIG. 2.

The programmable path with NOR gate 48 can be programmed to operate the driver in hybrid mode (dis_h=0) or can be programmed to operate the driver in normal mode (dis_h=1) Thus, the dashed line indicates that this circuit path in GPIO circuit 40 may be programmable to operate alternately as described above in relation to GPIO circuit 10, or as the hybrid operation described herein below.

Generally, the DDR interface implemented at high speeds is with reduced swing signaling, i.e. the signal does not swing from rail to rail. In DDR4 mode the output swing is restricted between 0.2V and 1.0V not from 0V to 1.2V. Due to the combination of voltage domain crossing and reduced swing requirements in DDR operation, this hybrid driver operation is very effective.

The p-channel and n-channel pre-driver (NAND gate 26 and NOR gate 28) and NOR gate 48 operate at $V_{DDaux}$ (e.g., 1.8V) and the pullup part of the driver (pullup transistors 44, 46) operates at $V_{CCO}$ (e.g., 1.2V). This establishes a voltage-domain crossing from 1.8V on the gates of pullup transistors 44 and 46 to 1.2V on the source of pullup transistor 44 and drain of pullup transistor 46. As indicated above, the real swing requirement for DDR4 is only up to 1.0V on I/O pad 16. This establishes a reduced voltage swing requirement for logic 1.

A pull up device in any I/O circuit is generally a p-channel transistor. A p-channel transistor can pull-up the I/O pad 16 to the full rail voltage, but will be slow due to its lower carrier mobility and high capacitances associated with its size. When an n-channel transistor is used to pull up the I/O pad 16, even though it would not be able to pull it up all the way to full rail voltage, it can pull up the I/O pad 16 three times faster than a p-channel until it reaches a voltage which is lower than its gate by a threshold voltage. As a DDR4 interface needs a reduced swing (0.2V to 1 v), this requirement is well within the performance limits of the n-channel pullup transistor 46 when used as pullup element. Due to the voltage domain crossing, from 1.8V (from the output of the pre-driver) on the gate of n-channel pullup transistor 46 to 1.2V on its drain, n-channel transistor 46 can work as a fast voltage pullup element in the required voltage range (0.2V to 1V). The advantage is a cumulative product of two factors. The first is the need for reduced signal swing at the I/O pad 16 and the second is the data signal passing from a high voltage domain ($V_{DDaux}$=1.8V) to a low voltage domain ($V_{CCO}$=1.2V).

The n-channel pullup transistor 46, when used as pull up element with its gate overdriven (1.8V) with respect to its drain (1.2V), will operate in saturation region until it turns off when the voltage at I/O pad 16 reaches 1.1V due to the excess voltage on its gate as compared to its drain. The DDR4 interface requirement is to pull the I/O pad 16 up to 1V and n-channel transistor 46 working in its saturation region is significantly faster than p-channel pullup transistor 44. When a p-channel transistor is used as a pullup element, its gate can only be driven to 0V; to overdrive such a p-channel pullup transistor requires provision of a negative gate voltage which is typically not readily available.

For other low speed interfaces like LVCMOS and LPDDR which need full rail to rail swing, the p-channel transistor 44 cooperates with n-channel transistor 46 to pull up to full rail voltage. In some detail, the programmable path driving the gate of the n-channel pullup transistor 46 is in the $V_{DDaux}$ supply domain and thus n-channel pullup transistor 46 can pull the I/O pad 16 close to the full rail voltage and then the p-channel pullup transistor 34 alone can continue to pull the I/O pad 16 up to the full rail voltage. The p-channel pullup transistor 44 can be comprised of five sub-transistors of width X each (effective size is 5×). In FIG. 2 when a hybrid driver is used, n-channel pullup transistor 46 with size X can replace three of the five sub-transistors of p-channel transistor 34, of FIG. 1 due to the fact that the mobility in NMOS transistors have three times the carrier mobility of p-channel transistors. This results in a 3×(1×n-channel pullup transistor 46 and 2× p-channel pullup transistor 44) sized hybrid pullup circuit which can replace a 5X sized prior art p-channel pullup transistor 34 of FIG. 1. The p-channel pullup transistor 44 is thus sized smaller than would otherwise be possible to pull the I/O pad 16 to full rail. The n-channel pullup transistor 46 is only 33% of the size of the p-channel pullup transistor 44, and, due to the support of the n-channel pullup transistor 46, the size of the p-channel pullup transistor 44 can be reduced by more than 50% as compared to p-channel pullup transistor 34. This effectively reduces the total size of the hybrid pullup device (both p-channel pullup transistor 44 and n-channel pullup transistor 46) by 40%.

The speed of a pullup transistor device is also a direct function of its self-capacitance, which is directly related to the sizes of the sources and drains of the transistors used to configure the pullup device. As size of the hybrid driver pullup element including p-channel transistor 44 and n-channel transistor 46 can be reduced by 40%, the device self capacitance will be reduced by 40%. The speed of the output driver will thus increase significantly as compare to the output driver of the prior art.

Figure 3A:
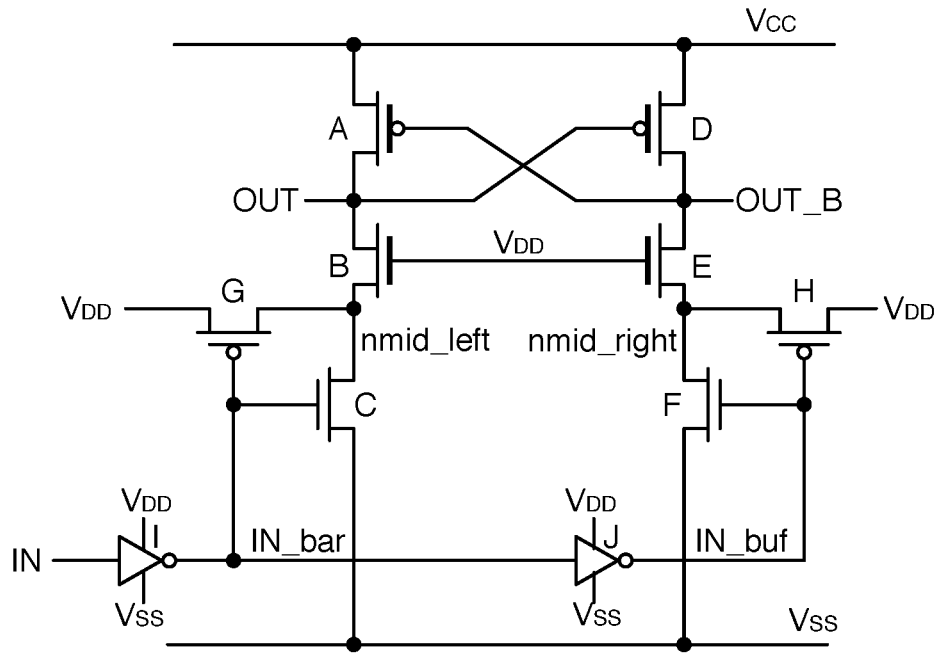
FIG. 3A is a schematic diagram of a representative prior-art level shifter circuit.
Figure 3B:
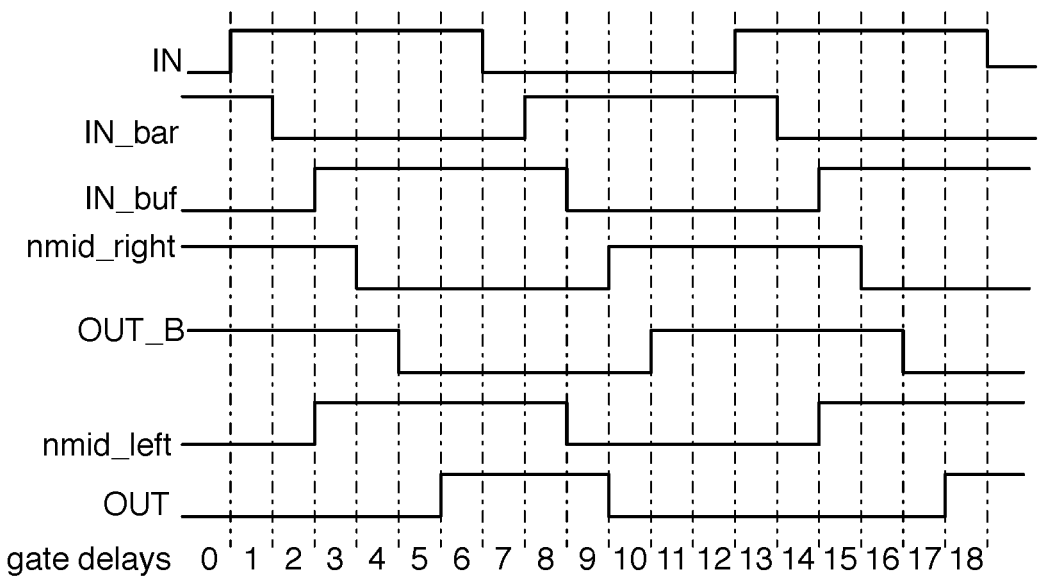
FIG. 3B is a timing diagram showing the operation of the level-shifter circuit of FIG. 3A.

Referring now to FIGS. 3A and 3B, a prior-art level-shifter circuit is shown along with a timing diagram illustrating its operation. An input signal on the input terminal IN is presented to an inverter I to produce a complementary signal IN_bar. A second inverter J cascaded with inverter I produces the signal IN_buf having the same polarity as the signal at the IN terminal. The two inverters I and J are in the in the $V_{DD}$ domain ($V_{DD}$=1V).

Two stacked transistor arrangements include a left-side p-channel transistor A in series with two left-side n-channel transistors B and C and a right-side p-channel transistor D in series with two right-side n-channel transistors E and F. A p-channel transistor G is connected between a node nmid_left and $V_{DD}$, its gate being connected to the gate of the lower left-side n-channel transistor C and to the node IN_bar. The node nmid_left is defined by the connection of the source of n-channel transistor B to the drain of n-channel transistor C. Similarly, a p-channel transistor H is connected between a node nmid_right and $V_{DD}$, its gate being connected to the gate of the lower right-side n-channel transistor F and to the node IN_buf. The node nmid_right is defined by the connection of the source of n-channel transistor E to the drain of n-channel transistor F. The sources of the left-side and right side p-channel transistors A and D are connected to $V_{CC}$ ($V_{CC}$=2.5V-3.3V).

As indicated by the thicker lines representing the gates of the p-channel transistors A and D and the upper n-channel transistors B and E in both stacks, the gate oxide layers of these transistors in both stacks are thicker than the gate oxide layers of the remaining transistors in the circuit because they must withstand the higher voltages present in the $V_{CC}$ domain, while the other transistors in the circuit (including the ones in the inverters) only need to withstand the voltages present in the $V_{DD}$ domain.

The timing diagram of FIG. 3B illustrates the circuit delay from a rising edge signal on the input terminal IN. Initially the left side p-channel transistor A is turned off and the right side p-channel transistor D is turned on. As may be seen from FIG. 3B, by virtue of passing through the first inverter I the signal at the node IN_bar is delayed from the signal at the input terminal IN and by virtue of passing through the second inverter J the signal at the node IN_buf is delayed from the signal at the node IN_bar.

The rising edge of the signal at node nmid_left is similarly delayed from the falling edge of the signal at the node IN_bar, since nmid_left is switched to a high level by p-channel transistor G turning on in response to a low level of signal at node IN_bar. The falling edge of the signal at node nmid_right is delayed from the rising edge of the signal at node IN_buf, since the falling edge of the signal at node nmid_right is caused by n-channel transistor F turning on, and p-channel transistor H turning off in response to the high level of the signal at node IN_buf. The falling edge of the signal at node OUT_B is delayed from the rising edge of the signal at node IN_buf since the falling of the signal at node nmid_right causes n-channel transistor E to turn on, which thus pulls down the signal at terminal OUT_B. N-channel transistor E is sized such that it can pull down the node OUT_B and can turn on the left side p-channel transistor A irrespective of the on-state of p-channel transistor D. The rising edge of the signal at node OUT is delayed from the falling of the signal at node OUT_B, since once the left side p-channel transistor A is turned on, node OUT is pulled up to $V_{CC}$ and this turns off transistor D, thus locking the circuit.

When a falling edge signal is now received at node IN, by virtue of passing through the first inverter I the rising edge of the signal at the node IN_bar is delayed from the signal at the input terminal IN and by virtue of passing through the second inverter J the falling edge of the signal at the node IN_buf is delayed from the rising edge of the signal at the terminal IN_bar.

The falling edge of the signal at node nmid_left is similarly delayed from the rising edge of the signal at the node IN_bar, since nmid_left is switched to a low level by p-channel transistor G turning off in response to a high level of signal at node IN_bar. The falling edge of node OUT is delayed from the falling edge of the signal at node nmid_left, since the falling edge of the signal at node nmid_left turns on left side n-channel transistor B, which is sized such that it can pull down the node OUT and can turn off the right side p-channel transistor D irrespective of the on-state of left side p-channel transistor A.

The rising edge of the signal at node nmid_right is delayed from the falling edge of the signal at node IN_buf, since the rising edge of the signal at node nmid_right is caused by n-channel transistor F turning off, and p-channel transistor H turning on in response to the low level of the signal at node IN_buf. The rising edge of the signal at node OUT_B is delayed from the rising edge of the signal at node nmid_right since the rising of the signal at node nmid_right causes right side n-channel transistor E to turn off, and as described above since right side p-channel transistor D is on, right side p-channel transistor D pulls up the signal at terminal OUT_B, thus locking the circuit.

As a result of the loop delays in the circuit of FIG. 3A the rising edge of OUT is delayed by five gate delays but its falling edge is delayed by three gate delays. As a result, the OUT signal spends less time at logic one and more time at logic zero as shown in FIG. 3B. This delay mismatch between the rising edge and falling edge distorts the duty cycle of the signal away from the ideal value of 50% and can be as bad as 30%. This means the OUT signal spends 70% of the time at logic 0 and 30% of the time at logic 1. As signaling speeds continue to increase in new signaling standards, the gate delays are almost close to the bit times, the specifications are very stringent and duty cycle distortion needs to be restricted to within 45% to 50%.

Figure 4A:
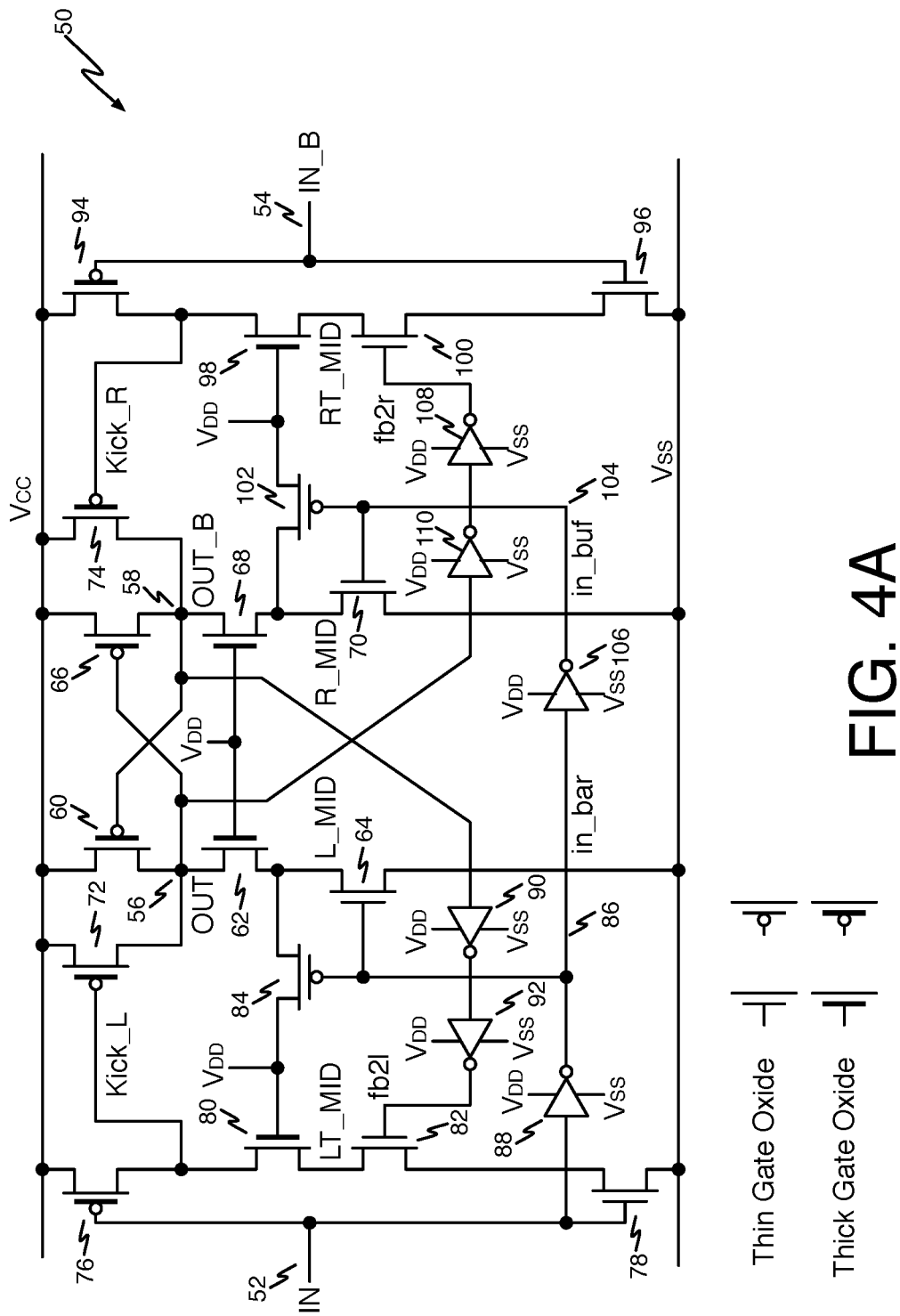
FIG. 4A is a schematic diagram of a level-shifter circuit in accordance with one aspect of the present invention.
Figure 4B:
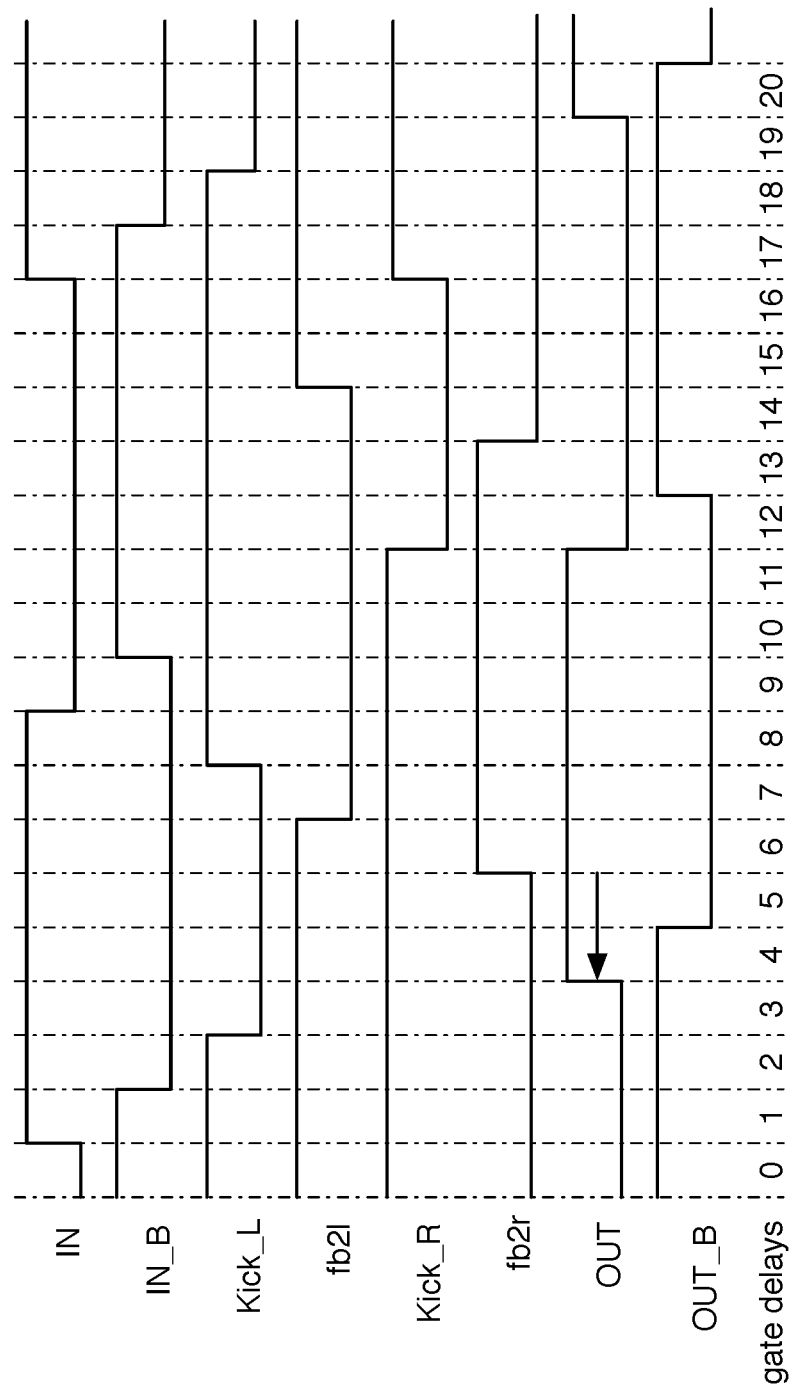
FIG. 4B is a timing diagram showing the operation of the level-shifter circuit of FIG. 4A.

Referring now to FIGS. 4A and 4B an illustrative embodiment of the present invention and its operation are shown. As in the prior-art level shifter circuit of FIG. 3A, level-shifter circuit 50 of the present invention includes two types of transistors, differentiated by the thickness of their gate oxides and their resulting higher breakdown voltages. The transistors having higher breakdown voltages are designated by having thicker lines representing their gates.

A level shifter circuit 50 in accordance with the present invention includes complementary input nodes IN (reference numeral 52) and IN_B (reference numeral 54) and complementary output nodes OUT (reference numeral 56) and OUT_B (reference numeral 58). Input nodes at 52 and 54 are in the $V_{DD}$ domain (nominally 1V) and output nodes at 56 and 58 are in the $V_{CC}$ domain (nominally 2.5-3.3V). It is to be understood that input IN_B 54 may be generated by an inverter from a signal appearing at input node IN, as described above. In FIG. 4A The supply voltage is labeled as $V_{CC}$ but when the level shifter circuit is used in the hybrid driver circuit of FIG. 2 persons of ordinary skill in the art will appreciate that it will be powered by the $V_{DDaux}$ supply.

Like the level-shifter circuit of FIG. 3A, level shifter circuit 50 includes two transistor stacks. A left side transistor stack includes thick-oxide p-channel transistor 60 connected in series with thick-oxide n-channel transistor 62 and n-channel transistor 64 between $V_{CC}$ and $V_{SS}$ (ground). A right side transistor stack includes thick-oxide p-channel transistor 66 connected in series with thick-oxide n-channel transistor 68 and n-channel transistor 70 between $V_{CC}$ and $V_{SS}$. The gate of p-channel transistor 60 is cross coupled to the common drain connections of p-channel transistor 66 and n-channel transistor 68 and denoted node OUT_B 58. The gate of p-channel transistor 66 is cross coupled to the common drain connections of p-channel transistor 60 and n-channel transistor 62 and denoted node OUT 56.

A Kick_L thick-oxide p-channel transistor 72 is connected across p-channel transistor 60 and a Kick_R thick-oxide p-channel transistor 74 is connected across p-channel transistor 66.

Input node IN 52 is connected to the gates of a p-channel transistor 76 and an n-channel transistor 78. A thick-oxide n-channel transistor 80 connected in series with an n-channel transistor 82 is connected between the drains of p-channel transistor 76 and n-channel transistor 78. The gate of Kick_L thick oxide p-channel transistor 72 is connected to the common drain connections of p-channel transistor 76 and thick oxide n-channel transistor 80. A p-channel transistor 84 is connected between the gate of n-channel transistor 80 and the source of n-channel transistor 62. The source of p-channel transistor 84 (as well as the gate of n-channel transistor 80) is further connected to $V_{DD}$ and its gate is connected to the gate of n-channel transistor 64 and to a node in_bar 86 at the output of an inverter 88 having an input connected to input node IN 52. Inverter 88 is powered by $V_{DD}$. The gate of n-channel transistor 82 is connected to the common drain connection of thick oxide p-channel transistor 66 and thick oxide n-channel transistor 68 at output node OUT_B 58 through cascaded inverters 90 and 92. Both inverters 90 and 92 are powered by $V_{DD}$.

Input node IN_B 54 is connected to the gates of p-channel transistor 94 and n-channel transistor 96. A thick-oxide n-channel transistor 98 connected in series with an n-channel transistor 100 is connected between the drains of p-channel transistor 94 and n-channel transistor 96. The gate of Kick_R thick oxide p-channel transistor 74 is connected to the common drain connections of p-channel transistor 94 and thick oxide n-channel transistor 98. A p-channel transistor 102 is connected between the gate of thick oxide n-channel transistor 98 and the source of thick oxide n-channel transistor 68. The source of p-channel transistor 102 (as well as the gate of n-channel transistor 98) is further connected to $V_{DD}$ and its gate is connected to the gate of n-channel transistor 70 and to a node in_buf 104 at the output of an inverter 106 having an input connected to in_bar node 86. Inverter 106 is powered by $V_{DD}$. The gate of n-channel transistor 100 is connected to the common drain connection of thick oxide p-channel transistor 60 and thick oxide n-channel transistor 62 at node OUT 56 through cascaded inverters 108 and 110. Both inverters 108 and 110 are powered by $V_{DD}$.

The invention uses the prior art level shifter circuit of FIG. 3A as a core level shifting element, but advantageously provides for an active trigger circuit to correct the delay mismatch observed between rising and falling edges. It advances the occurrence of the rising edge by two gate delays and will match the rising edge delay with the falling edge delay. This will ensure the output signal spends equal time at logic high and logic low, which results in a duty cycle of almost 50%.

FIG. 4B is a timing diagram showing the operation of the level shifter circuit 50 of FIG. 4A. Level shifter circuit 50 is well understood when it is analyzed during a static state and while transitioning between states. The description below will analyze the operation of level shifter circuit 50 starting with a logic 0 state at input node IN 52, while input node IN 52 transitions from logic 0 to logic 1 state, input node IN 52 at logic 1 state and while input node IN 52 transitions from logic 1 to logic 0 states. This completes a cycle of operation.

Starting with an initial state with node IN 52 at logic 0 (0V) and IN_B 14 at logic 1 (1V), the thick gate p-channel transistor 76 is on and thin gate n-channel transistor 78 is off. Irrespective of the state of thick gate n-channel transistor 80 and thin gate n-channel transistor 82, node KICK_L will therefore be at Vcc (2.3-3.3V), which will thus turn off thick gate p-channel transistor 72. Inverter 88, whose input is at 0V presented by IN 52 will drive its node in_bar 86 at the output of inverter 88 to logic 1 (1V), which will turn on thin gate n-channel transistor device 64, turn off thin gate p-channel transistor 84, and present logic 1 (1V) to inverter 106. Thick gate n-channel transistor 62 whose gate is always connected to $V_{DD}$ (1V) is also turned on. A logic 1 (1V) on the input of inverter 106 will drive its output node in_buf 104 to logic 0 (0V) and will turn off thin gate n-channel transistor 70. As a result when node IN 52 is at logic low, output node OUT 56 will be pulled towards logic low (0V), since as indicated above thick gate n-channel transistor 62 and thin gate n-channel transistor 64 are both on. As output node OUT 56 falls towards 0V, thick oxide p-channel transistor 66 will be turned on and as a result output node OUT_B 58 attains value of logic 1 (2.5-3.3V) and turns off thick gate p-channel transistor 60. Output node OUT_B 58 also presents logic 1 (2.5-3.3V) on gate of $V_{DD}$ powered inverter 90, which will present a logic 0 (0V) at the input of $V_{DD}$ powered inverter 92. This will result as logic 1 (1V) at node fb2l on the gate of thin gate n-channel transistor 82. Node IN_B 54 of a logic 1 (1V) is generated by inversion of node IN 52 (0V), which turns on thin gate n-channel transistor 96 but does not turn off thick gate p-channel transistor 94 since the source of thick gate transistor 94 is at 2.5-3.3V. Thick gate p-channel transistor 94 therefore pulls node KICK_R to logic 1 (2.5-3.3 v). Even though thick gate p-channel transistor 94 is not turned off, it will not sink current from $V_{CC}$ to $V_{SS}$ as thin gate n-channel transistor 100 is off since its gate is driven to logic 0 (0V) responsive to the logic 0 (0V) on node OUT 56 and the operation of inverters 110, 108. FIG. 4B shows initial node states when IN 52 node is at logic 0 (0V) at gate delay 0.

When a transition from logic 0 to logic 1 happens on node IN 52, as shown at the end of gate delay 0, thick gate p-channel transistor 76 will be weakened due to the increase (0V to 1V) of its gate voltage and thin gate n-channel transistor 78 is turned on. While node fb2l at logic 1 (1V) from its previous state is still maintained, the thick gate n-channel transistor 80 whose gate is connected $V_{DD}$ is not on until its source voltage drops at least one $V_{th}$ less than its gate voltage of $V_{DD}$. Thick gate n-channel transistor 80 takes one gate delay to turn on. N-channel transistors 80, 82 and 78 are sized to overpower thick oxide p-channel transistor 76 (already weakened by a logic 1 (1V) on its gate) and so the node KICK_L will be pulled down close to 0V after two gate delays. In particular, during the first gate delay node LT_MID is pulled down to 0 responsive to the turn on of thin gate n-channel transistor 78 and the second gate delay is needed to turn on thick gate n-channel transistor 80 to pull down node KICK_L. As node KICK_L approaches 0V, thick gate p-channel transistor 72 turns on and starts pulling node OUT 56 towards $V_{CC}$. The above action of output node OUT 56 reaching $V_{CC}$ is achieved with one gate delay from KICK_L node reaching logic 0 (0V), a total of three gate delays from the initial transition seen at node IN 52. As output node OUT 56 rises towards Vcc, thick gate p-channel transistor 66 is turned off after an additional gate delay, and thin gate n-channel transistor 100 is turned on responsive to inverters 110, 108 after two gate delays from the rising transition of the output node OUT 56.

In parallel with this action, a logic 0 to logic 1 transition on node IN 52 will appear on node in_buf 104 after two gate delays to turn on thin gate n-channel transistor 70. The turn on of thin gate n-channel transistor 70 pulls down the source of thick gate n-channel transistor 68 whose gate is at $V_{DD}$ thus turning it on after three gate delays from the transition at node IN 52. The logic 0 to logic 1 transition on node IN 52 will appear on node IN_B 54 after one gate delay as a transition from logic 1 to logic 0, fully turning on thick gate p-channel transistor 94. Fully turning on thick gate p-channel transistor 94 pulls up node Kick_R after an additional gate delay, thereby shutting off thick gate p-channel transistor 74 after three gate delays from the initial transition. This combination of turning on of thick gate n-channel transistor 68, thin gate n-channel transistor 70 and turning off of thick gate p-channel transistors 66 and 74, will drive output node OUT_B to logic 0 (0V) in four gate delays after the initial logic 0 to logic 1 transition occurs at input node IN 52. Output node OUT_B 54 at logic 0 (0V) will turn on thick gate p-channel transistor 60 and holds the output node OUT 56 at logic 1 (2.5-3.3V). Note that the transition from logic 0 (0V) to logic 1 (2.5-3.3V) of output node OUT 56 is not dependent on the positive feedback loop created by thick gate p-channel transistors 60 and 66, but is only maintained by that loop. At this point the level shifter circuit 50 has changed its state. This means that the output nodes OUT and OUT_B 56 and 58 are well set in their new states of logic 1 (2.5-3.3V) and logic 0 (0V) in three and four gate delays from gate delay 0, i.e. the initial transition, respectively. The node fb2r will realize a logic 1 (1V) in two gate delays from the transition of output node OUT 56 from logic 0 (0V) to logic 1 (2.5-3.3V), due to the two delays through $V_{DD}$ powered inverters 108 and 110, as described above. The node fb2l will realize a logic 0 (0V) in two gate delays from the transition of output node OUT_B 58 from logic 1 (2.5-3.3V) to logic 0 (1V), due to the two delays through $V_{DD}$ powered inverters 90 and 92, as shown at gate delay 6 in FIG. 4B. Node fb2l at logic 0 (0V) will turn off thin gate n-channel transistor 82 which disables the pull down path through n-channel transistors 80, 82, and 78 and enables weakly on thick gate p-channel transistor 76 to pull up the KICK_L node to $V_{CC}$ (2.5-3.3V) in one gate delay from the fb2l logic transition, as shown at gate delay 7 of FIG. 4B, which as described above turns off thick gate p-channel transistor 72.

When a transition from logic 1 (1V) to logic 0 (0V) happens on node IN 52, as shown at gate delay 8, which is not a function of a gate delay but is rather an indication of a minimal timing for proper operation, thick gate p-channel transistor 76 is turned on and thin gate n-channel transistor 78 is turned off. Irrespective of the state of thick gate n-channel transistor 80 and thin n-channel gate transistor 82, node KICK_L will be maintained at value of $V_{CC}$ (2.3-3.3V) due to the operation of thick gate p-channel transistor 76. This will not alter the state of thick gate p-channel transistor 72 which is off, as described above in relation to gate delay 7. Inverter 88 responds to the transition on node IN 52 and drives its output at node in bar 86 to logic 1 (1V), which turns off thin gate p-channel transistor 84 and turns on thin gate n-channel transistor 64 through which node L_MID node, common to n-channel transistors 62 and 64, is pulled to logic 0. This is achieved in two gate delays after the input IN 52 transition from logic 1 to logic 0, i.e. after gate delay 10. While the node L_MID falls towards logic 0, the thick gate n-channel transistor 62 which has its gate connected to $V_{DD}$ and drain at about $V_{CC}$ will consume one gate delay to turn on and pull down output node OUT 56 to logic 0 (0V), i.e. at gate delay 11. Output node OUT 56 thus reaches a logic low state within three gate delays after a logic 1 to logic 0 transition on input node IN 52. N-channel transistors 62, 64 are sized to overpower p-channel transistor 60 when on to pull down output node OUT 56 irrespective of the on state of p-channel transistor 60. This achieves the delay equalization (3 gate delays) on both rising and falling edges of the signal at node OUT 56 in relation to the signal at node IN 52 and maintains a duty cycle of 50%. This timing cycle repeats as shown in FIG. 4B.

The transition at node IN 52 from logic 1 to logic 0 at gate delay 8 propagates to node IN_B 54 at gate delay 9 as a transition from logic 0 to logic 1, which transitions thick gate p-channel transistor 94 from fully on to weakly on and turns on n-channel transistor 96 at gate delay 10. Since thin gate n-channel transistor 100 is still in the on state and thick gate n-channel transistor 98 is on, pulls down node Kick_R at gate delay 11. The pull down of node Kick_R at gate delay 11 turns on thick gate p-channel transistor 74 which pulls up node OUT_B 58 at gate delay 12. The transition from logic 1 to logic 0 of node OUT 56 at gate delay 11 propagates through inverters 110, 108 to node fb2r at gate delay 13. The transition from logic 0 to logic 1 of node OUT_B 58 at gate delay 12 propagates through inverters 90, 92 to node fb21 at gate delay 14, thus completing the cycle.

N-channel transistors 64, 70, 82, and 100 are thin oxide devices that can only take a maximum of 1.1V across their terminals. Because of this, the voltage at the nodes LT_MID, L_MID, R_MID, and RT_MID should not exceed $V_{DD}$ (1.1V). When OUT, OUT_B, KICK_L and KICK_R nodes swing from 0V to 3.3V, nodes LT_MID, L_MID, R_MID, and RT_MID are clamped not to exceed $V_{DD}$ voltage. The voltage swing on these nodes is restricted to between 0V and $V_{DD}$ by n-channel transistors 62, 68, 80, and 98, which respectively clamp the voltages at the sources of n-channel transistors 64, 70, 82, and 100 to no higher than $V_{DD}$.

As previously noted, n-channel transistors 62, 68, 80 and 98 are thick gate oxide NMOS transistors. Generally any n-channel transistor will turn itself off when its source voltage reaches its gate voltage and will not allow its source voltage go any higher than its gate voltage. Using this feature of n-channel transistors, when node OUT 56 reaches $V_{CC}$, the node between n-channel transistor 62 and n-channel transistor 64 will only reach $V_{DD}$ (1 v) after which the n-channel transistor 62 is turned off because its gate and source are at the same voltage. This would cause the common terminals of the source of n-channel transistor 62 and the drain of n-channel transistor 64 to float, but p-channel transistor 84 ties this node to $V_{DD}$. Similarly, when node OUT_B 58 reaches $V_{CC}$, the node between the source of n-channel transistor 68 and the drain of n-channel transistor 70 will only reach $V_{DD}$ (1 v) after which the n-channel transistor 68 is turned off because its gate and source are at the same potential. This would cause the common node between the source of n-channel transistor 68 and the drain of n-channel transistor 70 to float, but p-channel transistor 84, which is turned on when the signal at node IN 52 is low, will hold this node at $V_{DD}$.

Although the present invention has been discussed in considerable detail with reference to certain preferred embodiments, other embodiments are possible. Therefore, the scope of the appended claims should not be limited to the description of preferred embodiments contained in this disclosure.

What is claimed is:

1. A hybrid input/output pad driver for an integrated circuit comprising:
   an input node;
   a pullup-device driver having an input and an output, the input coupled to the input node;
   a pulldown-device driver having an input and an output, the input coupled to the input node;
   a pullup transistor connected between a terminal to receive a voltage potential in a voltage supply domain external to the integrated circuit and an input/output pad, and a gate coupled to the output of the pullup-device driver;
   a pulldown transistor connected between a common potential and the input/output pad, and a gate coupled to the output of the pulldown-device driver;
   an n-channel pullup transistor having a source coupled to the input/output pad, a drain coupled to the terminal to receive the voltage potential in the voltage supply domain external to the integrated circuit, and a gate; and
   a programmable connection between the output of the pullup driver circuit and the gate of the n-channel pullup transistor.

2. The hybrid input/output pad driver of claim 1 wherein the programmable connection between the output of the pullup driver circuit and the gate of the n-channel pullup transistor comprises a logic gate in the second voltage supply domain and having first and second inputs and an output, the first input of the logic gate having a connection to the output of the pullup driver circuit, the output of the logic gate having a connection to the gate of the n-channel pullup transistor, the second input of the logic gate having a connection to an enable line to configure a programmable connection between the output of the pullup driver circuit and the connection to the gate of the n-channel pullup transistor.

3. The hybrid input/output pad driver of claim 1 wherein the logic gate is a NOR gate.

4. The hybrid input/output driver of claim 1 wherein:
   the input node is in a first voltage supply domain internal to the integrated circuit and supplying a first voltage potential to operate circuit components in the first voltage supply domain in the integrated circuit; and
   the pullup device driver and the pulldown device driver are in a second voltage supply domain internal to the integrated circuit and supplying a second voltage potential to operate circuit components in the second voltage supply domain in the integrated circuit, the second voltage potential higher than the first voltage potential; and
   wherein the first voltage potential and the second voltage potential are both lower than the voltage potential in the voltage supply domain external to the integrated circuit.

5. The hybrid input/output pad driver of claim 4, wherein the input node is coupled to the inputs of the p-device driver and the n-device driver through a level shifter having an input coupled to the input node and an output coupled to the inputs of the p-device driver and the n-device driver, the level shifter having an input in the first voltage supply domain and an output in the second voltage supply domain.

6. The hybrid input/output pad driver of claim 1, wherein:
   the pullup device driver is a first gate having a first input coupled to the input node, a second input coupled to an output-enable line, and an output coupled to the gate of the pullup transistor; and
   the pulldown device driver is a second gate having a first input coupled to the input node, a second input coupled to the output-enable line, and an output coupled to the gate of the pullup transistor; and
   the first and second gates are configured to turn on only one of the pullup and pulldown transistors in response to a first logic state at the input node and only the other one of two logic states in response to a second logic state at the input node in the presence of an output-enable signal on the output-enable line.

7. The hybrid input/output pad driver of claim 4, wherein:
   the pullup device driver is a NAND gate having a first input coupled to the input node, a second input coupled to an output-enable line, and an output coupled to the gate of the pullup transistor; and
   the pulldown device driver is a NOR gate having a first input coupled to the input node, a second input coupled to the output-enable line through an inverter, and an output coupled to the gate of the pullup transistor.

8. The hybrid input/output pad driver of claim 1, wherein the integrated circuit is a user programmable integrated circuit.

9. The hybrid input/output pad driver of claim 1, wherein the integrated circuit is a field programmable gate array integrated circuit.

* * * * *